US012757749B2

(12) United States Patent
Lin et al.

(10) Patent No.: US 12,757,749 B2
(45) Date of Patent: Oct. 6, 2026

(54) PACKAGING STRUCTURE HAVING ORGANIC INTERPOSER LAYER AND METHOD FOR MANUFACTURING SAME

(71) Applicant: SJ Semiconductor(Jiangyin) Corporation, Jiangyin City (CN)

(72) Inventors: Chengchung Lin, Jiangyin City (CN); Yenheng Chen, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 447 days.

(21) Appl. No.: 18/235,894

(22) Filed: Aug. 21, 2023

(65) Prior Publication Data

US 2024/0063029 A1 Feb. 22, 2024

(30) Foreign Application Priority Data

Aug. 22, 2022 (CN) ......................... 202211002673.1

(51) Int. Cl.

*H10W 70/05* (2026.01)
*H10W 72/30* (2026.01)
*H10W 72/90* (2026.01)
*H10W 74/01* (2026.01)
*H10W 74/10* (2026.01)
*H10W 90/00* (2026.01)

(52) U.S. Cl.

CPC ....... *H10W 70/093* (2026.01); *H10W 74/019* (2026.01); *H10W 74/127* (2026.01); *H10W 90/701* (2026.01); *H10W 72/342* (2026.01); *H10W 72/344* (2026.01); *H10W 72/923* (2026.01); *H10W 72/932* (2026.01); *H10W 72/9415* (2026.01)

(58) Field of Classification Search

CPC . H10W 70/06; H10W 70/685; H10W 70/686; H10W 70/096; H10W 70/05; H10W 70/635

See application file for complete search history.

(56) References Cited

U.S. PATENT DOCUMENTS

| | | | | |
|---|---|---|---|---|
| 2016/0240391 | A1* | 8/2016 | Chen | H10W 74/014 |
| 2016/0240465 | A1* | 8/2016 | Chen | H10W 70/65 |
| 2020/0185352 | A1* | 6/2020 | Lee | H10W 90/00 |
| 2020/0348601 | A1* | 11/2020 | Kuo | G03F 7/70266 |

* cited by examiner

*Primary Examiner* — Jesse Y Miyoshi
(74) *Attorney, Agent, or Firm* — IPRTOP LLC

(57) ABSTRACT

A packaging structure having an organic interposer layer and a method for manufacturing the same are provided; the method comprises: forming a rewiring layer having metal wiring layers and inorganic dielectric layers over a semiconductor substrate; forming conductive pillars over the rewiring layer, and electrically connected to the rewiring layer; forming an organic dielectric layer over the rewiring layer, forming solder bumps over a thinned organic dielectric layer and thinned conductive pillars; bonding a support substrate to the solder bumps through an adhesive layer; removing the semiconductor substrate; forming bonding pads on an exposed surface of the metal wiring layers; connecting a cutting carrier to the bonding pads, and disengaging the support substrate by removing the adhesive layer. Interconnection between upper and lower layers is achieved by introducing the conductive pillars in the organic dielectric layer, without the need for complex processes such as forming through-silicon vias.

5 Claims, 4 Drawing Sheets

PACKAGING STRUCTURE HAVING ORGANIC INTERPOSER LAYER AND METHOD FOR MANUFACTURING SAME

CROSS REFERENCE TO RELATED APPLICATION

The present application claims the benefit of priority to Chinese Patent Application No. CN 202211002673.1, entitled "PACKAGING STRUCTURE HAVING ORGANIC INTERPOSER LAYER AND METHOD FOR MANUFACTURING SAME", filed with CNIPA on Aug. 22, 2022, the disclosure of which is incorporated herein by reference in its entirety for all purposes.

FIELD OF THE INVENTION

The present disclosure generally relates to semiconductor packaging, and in particular to a packaging structure having an organic interposer layer and a method for manufacturing the same.

BACKGROUND OF THE INVENTION

As electronic information technology advances rapidly and consumer demand continues to rise, electronic products are becoming smaller and more multi-functional. To fit more functional chips into a smaller package area, new packaging methods have been developed, including 2.5D packaging. The 2.5D packaging is an advanced form of heterogeneous chip packaging that allows for high-density connections among multiple chips. In this type of packaging, chips are placed side by side on top of an interposer layer and connected through micro bumps on the chips and wirings within interposer layers. The interposer layers are interconnected with Through-Silicon-Vias (TSVs) to allow for connections between upper and lower layers, and then attached to a traditional 2D packaging substrate using tin balls. The interposer layer is a conduit for electrical signals among the chips, thus allowing interconnection between the chips, and between the chips and the packaging substrate. In these cases, the interposer layer acts as a bridge between the chips and the circuit board. Traditional interposer layers are made of silicon and use a TSV process to achieve signal interconnection, but this method can be costly and difficult to control in terms of yield.

To address these issues, there is a need for an organic interposer packaging structure and a method for manufacturing the same that can reduce the cost of signal interconnection and improve yield control during the process.

SUMMARY

The present disclosure provides a method for manufacturing a packaging structure having an organic interposer layer, comprising: forming a rewiring layer over a semiconductor substrate, wherein the rewiring layer comprises metal wiring layers and inorganic dielectric layers, arranged in an alternatingly one above the other manner on the surface of the semiconductor substrate; forming conductive pillars over the rewiring layer, wherein the conductive pillars are electrically connected to the rewiring layer; forming an organic dielectric layer over the rewiring layer, with the organic dielectric layer covering the rewiring layer and the conductive pillars, and thinning the organic dielectric layer and the conductive pillars, wherein the thinned organic dielectric layer and the thinned conductive pillar are flush with each other; forming solder bumps over the thinned organic dielectric layer and the thinned conductive pillars, with the solder bumps electrically connected to the conductive pillars; bonding a support substrate to the solder bumps through an adhesive layer; removing the semiconductor substrate to expose a surface of the metal wiring layer facing away from the organic dielectric layer, and forming bonding pads on the exposed surface of the metal wiring layer, with the bonding pads being electrically connected to the metal wiring layer; and connecting a cutting carrier to the bonding pads, and disengaging the support substrate by removing the adhesive layer to obtain an intermediate structure.

The present disclosure also provides a packaging structure having an organic interposer layer, comprising: an organic dielectric layer; conductive pillars, extending through the organic dielectric layer; a rewiring layer, disposed over the organic dielectric layer, wherein the rewiring layer comprises metal wiring layers and inorganic dielectric layers, wherein the metal wiring layer is electrically connected to the conductive pillars; bonding pads, disposed over a surface of the rewiring layer facing away from the organic dielectric layer, and electrically connected to the rewiring layer; a sub-bump metal layer, disposed over a surface of the organic dielectric layer facing away from the rewiring layer, and electrically connected to the conductive pillars; and solder bumps, disposed over and electrically connected to the sub-bump metal layer.

REFERENCE NUMERALS

1—Semiconductor Substrate, 2—Rewiring Layer, 201—Metal Wiring Layer, 202—Inorganic Dielectric Layer, 3—Conductive Pillars, 4—Organic Dielectric Layer, 5—First Polymer Layer, 6—Sub-Bump Metal Layer, 7—Solder Bumps, 8—Protective Layer, 9—Adhesive Layer, 10—Support Substrate, 11—Second Polymer Layer, 12—Bonding Pads, 13—Cutting Carrier 14—Metal Frame, 15—Blade, 16—Functional Chips, 17—Filler Layer, 18—Encapsulation Layer, S1 to S7—Various Steps.

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 1-14. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

Embodiment 1

Figure 1:
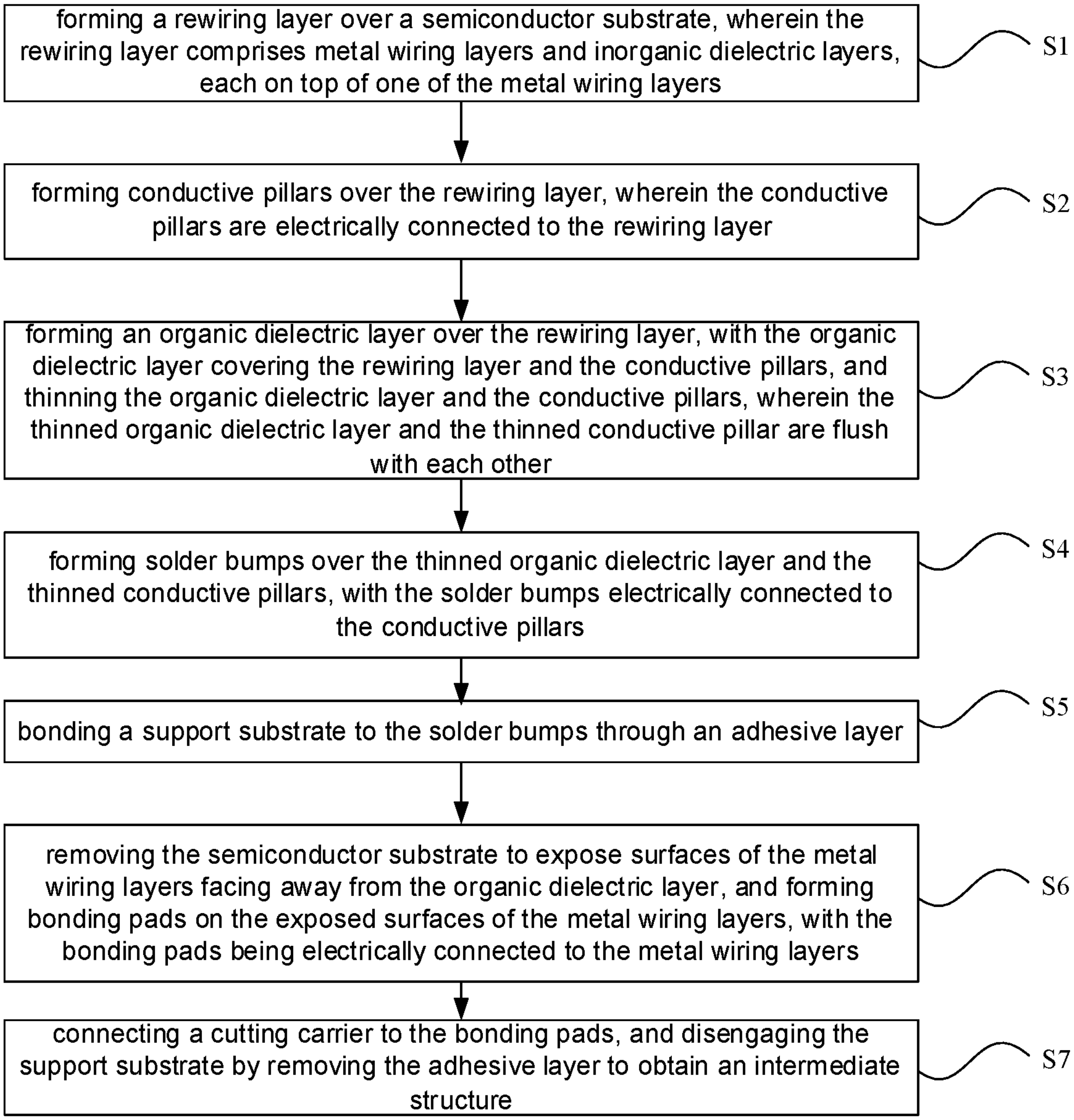
FIG. 1 is a flowchart illustrating a method for manufacturing a packaging structure having an organic interposer layer according to one embodiment of the present disclosure.

Embodiment 1 provides a method for manufacturing a packaging structure having an organic interposer layer, as shown in FIG. 1. The method comprises Steps S1-S7.

S1: providing a semiconductor substrate, forming a rewiring layer over the semiconductor substrate, wherein the rewiring layer comprises one or more metal wiring layers and one or more inorganic dielectric layers, each on top of one of the metal wiring layers, wherein the metal wiring layers and the inorganic dielectric layers are formed in an alternating sequence on a surface of the semiconductor substrate, and each of the wiring layers and each of the inorganic dielectric layers is patterned;

S2: forming conductive pillars over the rewiring layer, wherein the conductive pillars are electrically connected to the rewiring layer;

S3: forming an organic dielectric layer over the rewiring layer, with the organic dielectric layer covering the rewiring layer and the conductive pillars, and thinning the organic dielectric layer and the conductive pillars, wherein the thinned organic dielectric layer and the thinned conductive pillar are flush with each other;

S4: forming solder bumps over the thinned organic dielectric layer and the thinned conductive pillars, with the solder bumps electrically connected to the conductive pillars;

S5: providing a support substrate, and bonding the solder bumps to the support substrate through an adhesive layer;

S6: removing the semiconductor substrate to expose a surface of the metal wiring layer facing away from the organic dielectric layer, and forming bonding pads on the exposed surface of the metal wiring layer, with the bonding pads being electrically connected to the metal wiring layer; and

S7: connecting a cutting carrier to the bonding pads, and disengaging the support substrate by removing the adhesive layer to obtain an intermediate structure.

First, Step S1 is performed by: providing a semiconductor substrate 1, forming a rewiring layer 2 over the semiconductor substrate 1, wherein the rewiring layer 2 comprises one or more metal wiring layers 201 and one or more inorganic dielectric layers 202, each on top of one of the metal wiring layers, wherein the metal wiring layers and the inorganic dielectric layers are formed in an alternating sequence on a surface of the semiconductor substrate, and each of the wiring layers and each of the inorganic dielectric layers is patterned.

Figure 2:
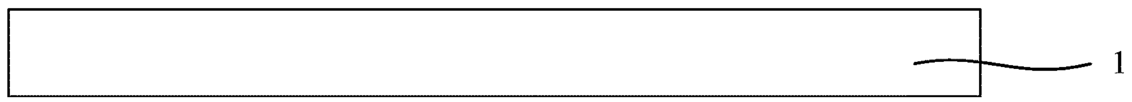
FIG. 2 is a schematic diagram showing a semiconductor substrate of the packaging structure having an organic interposer layer according to one embodiment of the present disclosure.

As an example, as shown in FIG. 2, the semiconductor substrate 1 is a silicon substrate, a germanium substrate, a germanium-silicon composite substrate, a sapphire substrate, a gallium nitride substrate, or other suitable substrate; specifically, in one embodiment, the semiconductor substrate 1 is made of a silicon wafer.

Figure 3:
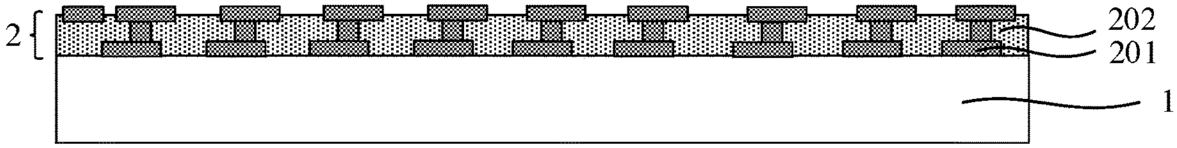
FIG. 3 is a schematic diagram showing an intermediate structure obtained after forming a rewiring layer over the semiconductor substrate according to one embodiment of the present disclosure.

As an example, as shown in FIG. 3, the rewiring layer 2 comprises one or more metal wiring layers 201 and one or more inorganic dielectric layers 202, each on top of one of the metal wiring layers, wherein the metal wiring layers and the inorganic dielectric layers are formed in an alternating sequence on a surface of the semiconductor substrate, and each of the wiring layers and each of the inorganic dielectric layers is patterned.

As an example, forming the rewiring layer 2 comprises:

(1) forming the metal layer on the semiconductor substrate 1 using one of sputtering, electroplating, chemical plating, or other suitable process, and patterning the metal layers to form the metal wiring layers 201. A material of the metal wiring layers 201 comprises, but is not limited to, one or more of copper, aluminum, nickel, gold, silver, and titanium.

(2) forming the inorganic dielectric layer 202 on the metal wiring layers 201 using a chemical vapor deposition process, physical vapor deposition, or other suitable process, and etching the inorganic dielectric layer 202 to form patterned through holes. A material of the inorganic dielectric layer 202 comprises, but is not limited to, one or more of silicon oxide, silicon nitride, fluorinated glass, Polybenzoxazole (PBO), and Benzocyclobutene (BCB). In one embodiment, the inorganic dielectric layer is preferably made of silicon oxide to further reduce manufacturing difficulty as well as manufacturing costs.

It should be noted that the rewiring layer may comprise multiple metal wiring layers and multiple inorganic dielectric layers, each on top of one of the metal wiring layers, wherein the metal wiring layers and the inorganic dielectric layers are formed in an alternating sequence on a surface of the semiconductor substrate, and each of the wiring layers and each of the inorganic dielectric layers is patterned; and each two adjacent metal wiring layers are electrically connected by conductive plugs formed in the through holes of the inorganic dielectric layer between the two adjacent metal wiring layers.

Figure 4:
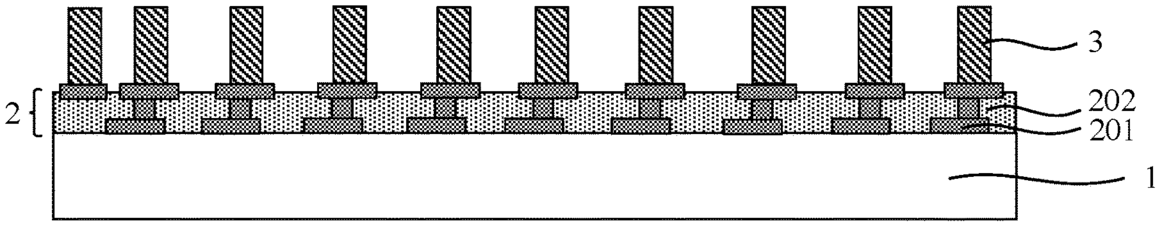
FIG. 4 is a schematic diagram showing an intermediate structure obtained after forming conductive pillars over the rewiring layer according to one embodiment of the present disclosure.
Figure 5:
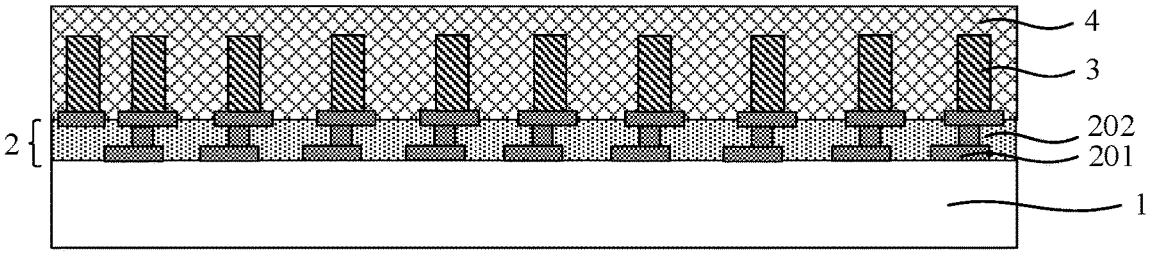
FIG. 5 is a schematic diagram showing an intermediate structure obtained after forming an organic dielectric layer on the rewiring layer according to one embodiment of the present disclosure.

Referring to FIG. 4, Step S2 is then performed by forming conductive pillars 3 over the rewiring layer 2, wherein the conductive pillars 3 are electrically connected to the rewiring layer 2.

As an example, a material of the conductive pillars 3 comprises electroplated copper; when the conductive pillars 3 are made of copper, the conductive pillars 3 are preferably formed by electroplating, in which case, using electroplated copper not only helps to shorten the process time, but also enhances the bonding strength between the conductive pillars 3 and the metal wiring layer 201, and the conductivity of the conductive pillars 3 themselves. This helps to reduce device resistance, reduce device power consumption, and improve device performance. Optionally, the conductive pillars 3 may also be made of one or more of aluminum, nickel, gold, silver, titanium, and they may be formed using a deposition process, a chemical plating process, or other suitable processes.

It should be emphasized that the conductive pillars 3 are directly formed on the surface of the rewiring layer 2. Since there are no intervening structures, there is no need to worry about adverse effects on intervening structures during the manufacturing process, and alignment between the conductive pillars 3 and the metal wiring layer 201 can be more easily achieved. Compared with the traditional method of first forming a dielectric layer and then forming through holes in the dielectric layer and depositing metal, the process is greatly simplified and conducive to improving production yield.

Then Step S3 is performed by forming an organic dielectric layer 4 over the rewiring layer 2, with the organic dielectric layer 4 covering the rewiring layer 2 and the conductive pillars 3, and thinning the organic dielectric layer 4 and the conductive pillars 3, wherein the thinned organic dielectric layer 4 and the thinned conductive pillar 3 are flush with each other;

As an example, the organic dielectric layer 4 may be formed by one of compression molding, transfer molding, liquid seal molding, vacuum lamination, and spin coating. A material of the organic dielectric layer 4 comprises one or more of epoxy resin, polyamide, polymer-based material, resin-based material, and any other suitable material.

Figure 6:
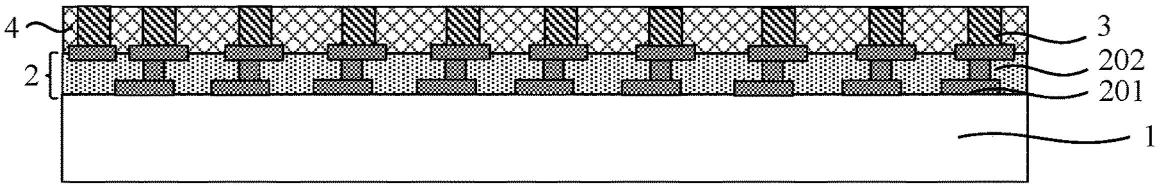
FIG. 6 is a schematic diagram showing an intermediate structure obtained after thinning the organic dielectric layer and the conductive pillars according to one embodiment of the present disclosure.

As an example, as shown in FIG. 6, the organic dielectric layer 4 and the conductive pillars 3 may be thinned by grinding or polishing.

Figure 7:
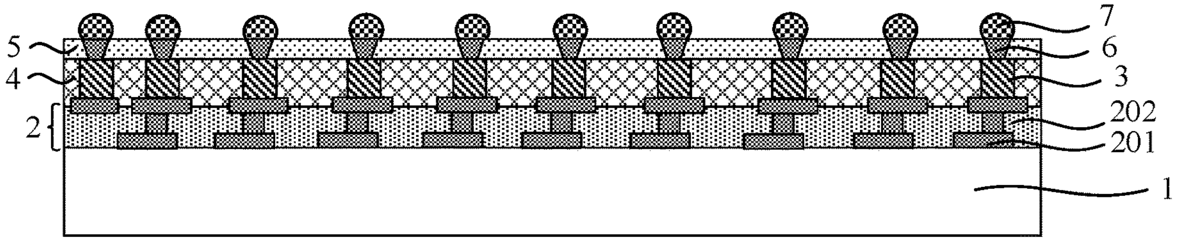
FIG. 7 is a schematic diagram showing an intermediate structure obtained after forming solder bumps on the thinned conductive pillars according to one embodiment of the present disclosure.

Referring to FIG. 7, Step S4 is then performed by: forming solder bumps 7 over the thinned organic dielectric layer 4 and the thinned conductive pillars 3, with the solder bumps 7 electrically connected to the conductive pillars 3.

As an example, forming the solder bumps 7 comprises:

(1) forming a first polymer layer 5 over the thinned organic dielectric layer 4, and forming openings in the first polymer layer 5 on top of conductive pillars 3, with the openings at least partially exposing the conductive pillars 3;

(2) forming a sub-bump metal layer 6 in the openings and over the conductive pillars 3; and (3) forming the solder bumps 7 over the sub-bump metal layer 6, wherein the solder bumps 7 extend above the first polymer layer 5.

As an example, each of the solder bumps 7 may be composed of a metal pillar and a solder joint, or simply be a tin ball.

Figure 8:
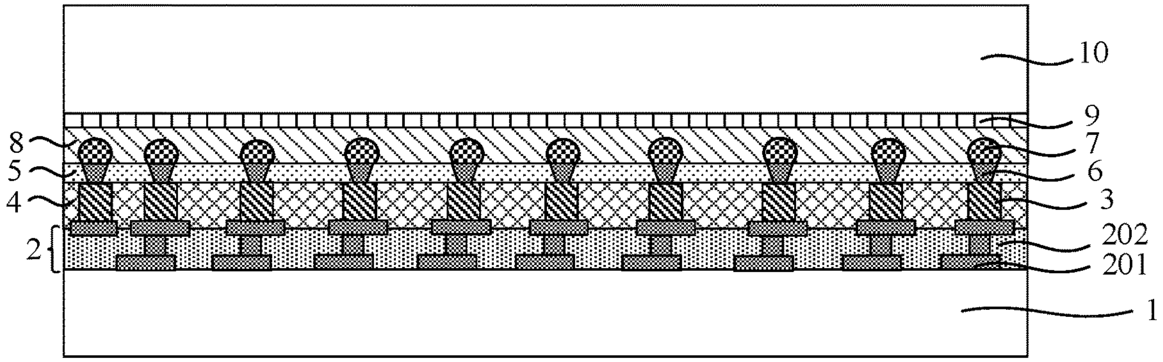
FIG. 8 is a schematic diagram showing an intermediate structure obtained after bonding a support substrate to the solder bumps through an adhesive layer according to one embodiment of the present disclosure.

Referring to FIG. 8, Step S5 is then performed by bonding a support substrate 10 to the solder bumps 7 through an adhesive layer 9.

As an example, the support substrate 10 is used to prevent the layer structure from cracking, warping, breaking, etc. during the packaging process, and the support substrate 10 may be wafer-like, panel-like, or of any other desired shape. It may be made of materials comprising one or more of glass, metal, semiconductor, polymer, ceramic. In one embodiment, the support substrate 10 is made of glass, which is less expensive and makes it easy to remove the support substrate in a subsequent peeling process.

As an example, the adhesive layer 9 is made of a tape or a polymer layer, and may be cured by UV curing or heat curing.

As an example, in order to avoid damaging the solder bumps 7 when bonding them to the bonding layer 9, a protective layer 8 is formed over the solder bumps 7 before the bonding; the protective layer 8 may be of the same material as the bonding layer 9 or of any other suitable material.

Then step S6 is performed by removing the semiconductor substrate 1 to exposing a surface of the metal wiring layer 201 facing away from the organic dielectric layer 4, and forming bonding pads 12 on the exposed surface of the metal wiring layer 201, with the bonding pads 12 being electrically connected to the metal wiring layer 201.

Figure 9:
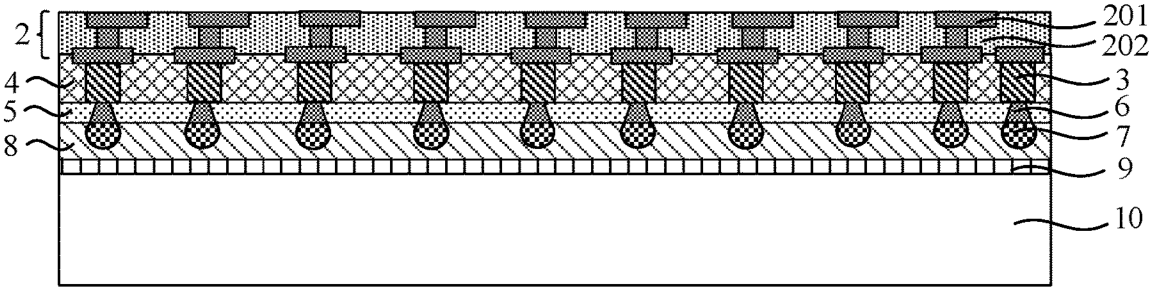
FIG. 9 is a schematic diagram showing an intermediate structure obtained after removing the semiconductor substrate to expose a metal wiring layer of the rewiring layer according to one embodiment of the present disclosure.

As an example, as shown in FIG. 9, the semiconductor substrate 1 is removed, for example, by mechanical stripping, a thinning process, or other suitable method, so that the metal wiring layer 201 is exposed.

Figure 10:
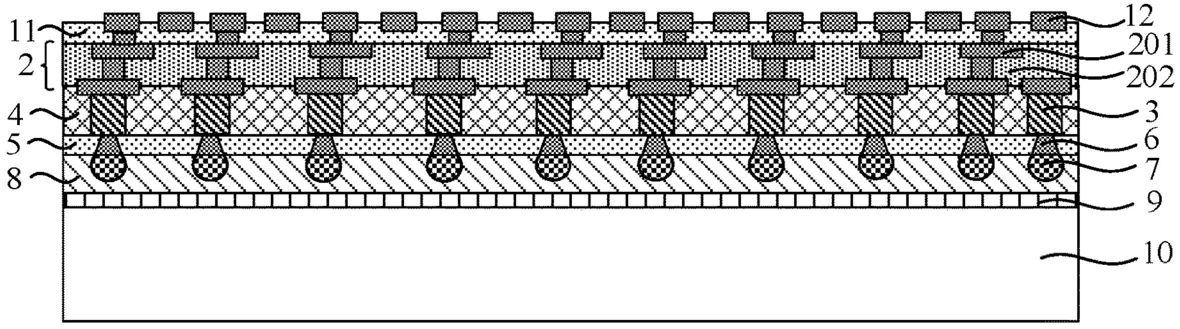
FIG. 10 is a schematic diagram showing an intermediate structure obtained after forming bonding pads over the exposed metal wiring layer according to one embodiment of the present disclosure.

As an example, as shown in FIG. 10, forming the bonding pads 12 on the exposed surface of the metal wiring layer 201 comprises: first forming a second polymer layer 11 over the rewiring layer 2 by chemical vapor deposition, physical vapor deposition, or other suitable techniques after removal of the semiconductor substrate 1, patterning the second polymer layer 11 to form through-holes exposing the metal wiring layer 201; second, forming the bonding pads 12 over the patterned second polymer layer by sputtering, electroplating, chemical plating, or other suitable techniques, wherein the bonding pads 12 are electrically connected to the metal wiring layer 201 through the through-holes.

Figure 11:
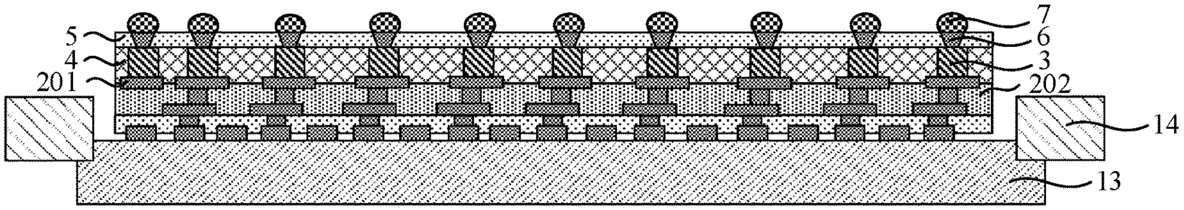
FIG. 11 is a schematic diagram showing an intermediate structure obtained after connecting a cutting carrier to the bonding pads, and removing the support substrate according to one embodiment of the present disclosure.

Referring to FIG. 11, step S7 is then performed by connecting a cutting carrier 13 to the bonding pads 12, and disengaging the support substrate 10 by removing the adhesive layer 9.

As an example, the cutting carrier 13 is fixed to a metal frame 14.

Specifically, depending on the type of the bonding layer 9, disengaging the support substrate 10 by removing the adhesive layer 9 may comprise: first making the adhesive layer 9 less adhesive and then peeling off the bonding layer 9 together with the support substrate 10. For example, when the adhesive layer 9 is made of a photo-thermal conversion material, a laser may be employed to irradiate the photo-thermal conversion layer to remove the adhesive layer 9 and the supporting substrate 10, to obtain an intermediate structure.

As an example, the method may further comprise a step of removing the protective layer 8 to expose the solder bumps 7.

Figure 12:
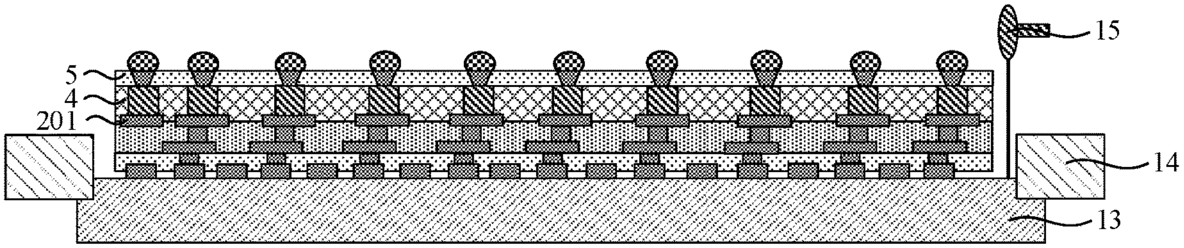
FIG. 12 is a schematic diagram showing an intermediate structure obtained after cutting the intermediate structure shown in FIG. 11 according to one embodiment of the present disclosure.
Figure 13:
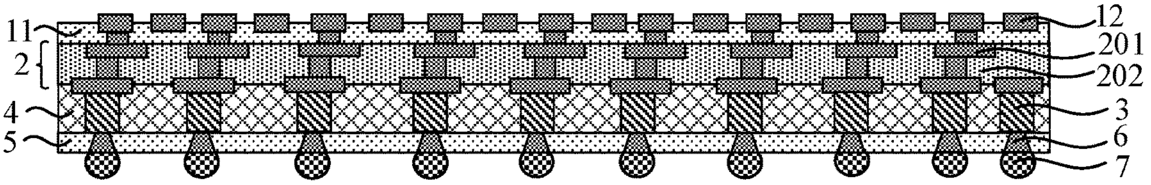
FIG. 13 is a schematic diagram showing an intermediate structure obtained after removing the cutting carrier and removing the support substrate according to one embodiment of the present disclosure.

The method further comprises cutting the intermediate structure formed on the cutting carrier 13 by a blade 15 to obtain a plurality of pre-encapsulation structures as shown in FIG. 12.

As an example, the method further comprises: removing the cutting carrier 13, electrically connecting functional chips 16 to the bonding pads 12, and forming an encapsulation layer 18 over the functional chips 16.

As an example, the cutting carrier 13 is removed using a stripping process or other suitable techniques.

As an example, the functional chips 16 comprise one or more of a processor, a memory, a power management unit, a radio-frequency (RF) component, etc. A high-density multi-chip interconnection package is achieved by packaging a plurality of the functional chips 16 in a single packaging system.

As an example, after the functional chips 16 are connected to the bonding pads 12, a filler layer 17 is formed, filling gaps between the functional chips 16 and the bonding pads 12; the filler layer 17 can protect the connection between the functional chips 16 and the bonding pads 12 from corrosion or physical damage, and can also improve the bonding strength between the functional chips 16 and the bonding pads 12, thereby improving the mechanical strength of the entire packaging structure.

Techniques of forming the encapsulation layer 18 comprise, but not limited to, compression molding, transfer molding, liquid seal molding, vacuum lamination, and spin coating; the encapsulation layer 18 is made of curable materials, such as polymer-based materials, resin-based materials, polyamide, epoxy resin, and any combination thereof.

In the method for manufacturing a packaging structure having an organic interposer layer, interconnection between upper and lower layers is achieved by introducing the conductive pillars in the organic dielectric layer, which replaces through-silicon vias and therefore reduces manufacturing costs, and the conductive pillar process has a higher yield than the traditional through-silicon via process. Also, this method can achieve high-density interconnection packaging, optimize packaging volume, and can be used for 2.5D and 3D fan-out packaging.

Embodiment 2

Figure 14:
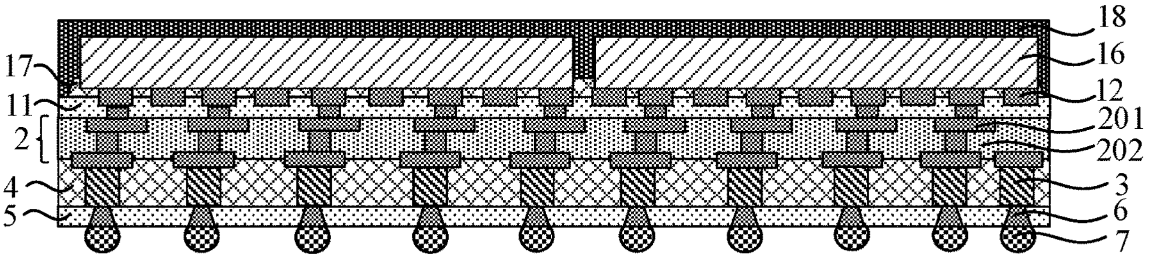
FIG. 14 is a schematic diagram showing an intermediate structure obtained after attaching functional chips to the bonding pads and encapsulating the chips according to one embodiment of the present disclosure.

As shown in FIG. 14, the present disclosure also provides a packaging structure having an organic interposer layer, which may or may not be manufactured by the method described in Embodiment 1. The packaging structure having an organic interposer layer comprises an organic dielectric layer 4, conductive pillars 3, a rewiring layer 2, bonding pads 12, a sub-bump metal layer 6, and solder bumps 7; the conductive pillars 3 extend through the organic dielectric layer 4; the rewiring layer 2 is disposed over the organic dielectric layer 4, the rewiring layer 2 comprises metal wiring layer 201 and inorganic dielectric layers 202, wherein the metal wiring layers 201 is connected to the conductive pillars 3; the bonding pads 12 are disposed over a surface of the rewiring layer 2 away from the organic dielectric layer 4, and are electrically connected to the rewiring layer 2; the sub-bump metal layer 6 is disposed over a surface of the organic dielectric layer 4 facing away from the rewiring layer 2, and is electrically connected to the conductive pillars 3; the solder bumps 7 are disposed over and electrically connected to the sub-bump metal layer 6.

As an example, the packaging structure having an organic interposer layer further comprises a first polymer layer 5 located between the organic dielectric layer 4 and the solder bumps 7, and the sub-bump metal layer 6 extends through the first polymer layer 5 to electrically connect the conductive pillar 3 and the solder bumps 7.

As an example, the rewiring layer 2 comprises two or more metal wiring layers 201 and two or more inorganic dielectric layers 202.

As an example, the packaging structure having an organic interposer layer further comprises a second polymer layer 11 located between the bonding pads 12 and the rewiring layer 2; through holes are formed in the second polymer layer 11, and the bonding pads 12 are electrically connected to the metal wiring layer 201 through the through holes.

As an example, the conductive pillars 3 comprises electroplated copper and may also be other suitable conductive material.

As an example, the packaging structure having an organic interposer layer further comprises functional chips 16, a filler layer 17, and an encapsulation layer 18; the functional chips 16 are located above the bonding pads 12 and electrically connected to the bonding pads 12; the filler layer 17 fills gaps between the functional chips 16 and the bonding pads 12; the encapsulation layer 18 covers the bonding pads 12 and the functional chips 16.

As an example, the number of the functional chips 16 is two or more; the functional chips 16 comprise one or more of a processor, a memory, a power management unit, a radio-frequency (RF) component, etc.

In summary, the present application discloses the packaging structure having an organic interposer layer and the method for manufacturing a packaging structure having an organic interposer layer. In this structure, interconnections between upper and lower device layers are achieved by the conductive pillars introduced to embed in the organic dielectric layer, which replaces traditional through-silicon vias, therefore reduces manufacturing costs. The conductive pillar process has a higher yield than the traditional through-silicon via process. In addition, the present disclosed technique can achieve high-density interconnection packaging, optimized packaging volume, and can be used for 2.5D and 3D fan-out packaging. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for manufacturing a packaging structure having an organic interposer layer, comprising:

forming a rewiring layer over a semiconductor substrate, wherein the rewiring layer comprises metal wiring layers and inorganic dielectric layers, wherein each of the inorganic dielectric layers is placed on top of one of the metal wiring layers, wherein the metal wiring layers and the inorganic dielectric layers are formed in an alternating sequence on a surface of the semiconductor substrate;

forming conductive pillars over the rewiring layer, wherein the conductive pillars are electrically connected to the rewiring layer;

forming an organic dielectric layer over the rewiring layer, with the organic dielectric layer covering the rewiring layer and the conductive pillars, and thinning the organic dielectric layer and the conductive pillars, wherein the thinned organic dielectric layer and the thinned conductive pillar are flush with each other;

forming solder bumps over the thinned organic dielectric layer and the thinned conductive pillars, with the solder bumps electrically connected to the conductive pillars;

bonding a support substrate to the solder bumps through an adhesive layer;

removing the semiconductor substrate to expose surfaces of the metal wiring layers facing away from the organic dielectric layer, and forming bonding pads on the exposed surfaces of the metal wiring layers, with the bonding pads being electrically connected to the metal wiring layers;

connecting a cutting carrier to the bonding pads, and disengaging the support substrate by removing the adhesive layer to obtain an intermediate structure, wherein the cutting carrier is fixed to a frame;

cutting the intermediate structure to obtain multiple pre-encapsulation structures after disengaging the support substrate;

removing the cutting carrier from the bonding pads in the intermediate structure; and bonding functional chips to the bonding pads in the intermediate structure, wherein the functional chips are then electrically connected to the bonding pads.

2. The method according to claim 1, further comprising:

forming a filler layer at gaps between the functional chips and the bonding pads; and forming an encapsulation layer over the bonding pads, covering the functional chips.

3. The method according to claim 1, wherein before bonding the solder bumps to the support substrate, the method further comprises: forming a protective layer covering the solder bumps.

4. The method according to claim 1, wherein forming the solder bumps over the thinned organic dielectric layer and the thinned conductive pillars comprises:

forming a polymer layer over the thinned organic dielectric layer, and forming openings in the polymer layer, wherein the openings at least partially expose the conductive pillars;

forming a sub-bump metal layer in the openings over the conductive pillars; and forming the solder bumps over the sub-bump metal layer, wherein the solder bumps extend beyond the polymer layer.

5. The method according to claim 1, wherein the rewiring layer comprises two or more metal wiring layers and two or more inorganic dielectric layers, and wherein each of the wiring layers and each of the inorganic dielectric layers is patterned.

* * * * *